US012696761B2

(12) United States Patent (10) Patent No.: US 12,696,761 B2
Ellis et al. (45) Date of Patent: Jul. 28, 2026

(54) SYNTHETIC DIAMOND PLATES

(71) Applicant: ELEMENT SIX TECHNOLOGIES LIMITED, Didcot (GB)

(72) Inventors: Julian Ellis, Didcot (GB); John Brandon, Didcot (GB); Francis Mark Reininger, Pasadena, CA (US)

(73) Assignee: ELEMENT SIX TECHNOLOGIES LIMITED, Didcot (GB)

( * ) Notice: Subject to any disclaimer, the term of this patent is extended or adjusted under 35 U.S.C. 154(b) by 45 days.

(21) Appl. No.: 17/455,910

(22) Filed: Nov. 19, 2021

(65) Prior Publication Data

US 2022/0122900 A1 Apr. 21, 2022

Related U.S. Application Data

(63) Continuation of application No. 16/464,397, filed as application No. PCT/EP2017/082962 on Dec. 15, 2017, now Pat. No. 11,211,306.

(Continued)

(30) Foreign Application Priority Data

Jan. 24, 2017 (GB) ...................................... 1701173

(51) Int. Cl.
 *H10W 40/25* (2026.01)
 *C30B 25/18* (2006.01)
 (Continued)

(52) U.S. Cl.
 CPC ........... *H10W 40/254* (2026.01); *C30B 25/18* (2013.01); *C30B 29/04* (2013.01); *C30B 29/64* (2013.01)

(58) Field of Classification Search
 CPC .................................................. H01L 23/3732
 See application file for complete search history.

(56) References Cited

U.S. PATENT DOCUMENTS 2,882,974 A * 4/1959 Boegehold .............. B64C 11/24
 416/233
3,895,313 A * 7/1975 Seitz ......................... H01S 3/08
 428/912.2

(Continued)

FOREIGN PATENT DOCUMENTS

EP 0636706 A2 2/1995
EP 1708255 A2 10/2006

(Continued)

OTHER PUBLICATIONS

Machine language translation of JP-H-11265962-A (Year: 1999).*

(Continued)

*Primary Examiner* — Erik Kielin
(74) *Attorney, Agent, or Firm* — Kilpatrick Townsend & Stockton LLP

(57) ABSTRACT

A synthetic diamond plate comprises a polygonal plate formed of synthetic diamond material, the polygonal plate of synthetic diamond material having a thickness in a range 0.4 mm to 1.5 mm, and rounded corners having a radius of curvature in a range 1 mm to 6 mm. A mounted synthetic diamond plate is also disclosed comprising a polygonal synthetic diamond plate as described and a base to which the polygonal synthetic diamond plate is bonded, wherein the base comprises a cooling channel. An array of mounted synthetic diamond plates is also described, comprising a plurality of mounted synthetic diamond plates described above, wherein the cooling channels of the mounted synthetic diamond plates are linked to form a common cooling channel across the array of mounted synthetic diamond plates.

6 Claims, 4 Drawing Sheets

Related U.S. Application Data

(60) Provisional application No. 62/438,394, filed on Dec. 22, 2016.

(51) Int. Cl.
   *C30B 29/04* (2006.01)
   *C30B 29/64* (2006.01)

(56) References Cited

U.S. PATENT DOCUMENTS

| | | | | |
|---|---|---|---|---|
| 5,084,595 | A * | 1/1992 | Imai | H01L 23/13 |
| | | | | 174/50 |
| 5,243,311 | A * | 9/1993 | Jones | H01P 1/08 |
| | | | | 333/252 |
| 5,642,779 | A | 7/1997 | Yamamoto et al. | |
| 5,849,228 | A | 12/1998 | Patton, Jr. et al. | |
| 6,101,715 | A | 8/2000 | Fuesser et al. | |
| 6,762,491 | B1 * | 7/2004 | Hatae | H01L 25/072 |
| | | | | 257/772 |
| 10,256,202 | B1 * | 4/2019 | Spry | H01L 23/5226 |
| 11,211,306 | B2 * | 12/2021 | Ellis | C30B 29/04 |
| 2002/0186545 | A1 | 12/2002 | Fukada et al. | |
| 2003/0123160 | A1 * | 7/2003 | Zeller | B23K 26/702 |
| | | | | 359/819 |
| 2003/0188681 | A1 * | 10/2003 | Brandon | H01P 1/08 |
| | | | | 117/84 |
| 2005/0180472 | A1 * | 8/2005 | Tzuk | H01S 3/042 |
| | | | | 372/36 |
| 2007/0020794 | A1 * | 1/2007 | DeBar | B81C 1/00547 |
| | | | | 347/68 |
| 2008/0142954 | A1 * | 6/2008 | Hu | H01L 25/0655 |
| | | | | 257/713 |
| 2011/0005810 | A1 * | 1/2011 | Uneno | H01L 21/4846 |
| | | | | 174/250 |
| 2012/0312682 | A1 | 12/2012 | Wilman et al. | |
| 2013/0112993 | A1 | 5/2013 | Hayashi et al. | |
| 2014/0342122 | A1 | 11/2014 | Inglis et al. | |
| 2015/0222087 | A1 * | 8/2015 | Williams | C30B 25/105 |
| | | | | 427/575 |
| 2015/0294922 | A1 * | 10/2015 | Twitchen | C23C 16/27 |
| | | | | 257/615 |
| 2016/0079152 | A1 * | 3/2016 | Obara | H01L 23/49894 |
| | | | | 257/77 |

FOREIGN PATENT DOCUMENTS

| | | | |
|---|---|---|---|
| JP | S5972752 | U | 5/1984 |
| JP | 06212874 | A | 8/1994 |
| JP | 0758256 | A | 3/1995 |
| JP | 11265962 | A * | 9/1999 |
| JP | 2010024506 | A | 2/2010 |
| WO | 9803996 | A1 | 1/1998 |
| WO | 2016126787 | A1 | 8/2016 |

OTHER PUBLICATIONS

"Diamant-Laserfenster", Diamond Materials, Available online at: http://www.diamond-materials.com:80/DE/products/optical_windows/laser_windows.htm, Jun. 14, 2011, 1 page.

"Polycrystalline CVD Diamond", II-VI Advanced Materials, Brochure, Available online at: www.iiviadvmat.com, May 1, 2015, 4 pages.

U.S. Appl. No. 16/464,397, "Non-Final Office Action", May 25, 2021, 13 pages.

U.S. Appl. No. 16/464,397, "Notice of Allowance", Sep. 1, 2021, 7 pages.

GB1701173.5, "Combined Search and Examination Report", Jun. 20, 2017, 8 pages.

GB1720921.4, "Combined Search and Examination Report", Jun. 6, 2018, 8 pages.

PCT/EP2017/082962, "International Search Report and Written Opinion", Jun. 7, 2018, 18 pages.

Wild, "CVD Diamond for Optical Windows", Low-Pressure Synthetic Diamond, Springer, XP009185890, Chapter 10, Jan. 1, 1998, pp. 189-206.

* cited by examiner

SYNTHETIC DIAMOND PLATES

CROSS-REFERENCES TO RELATED APPLICATIONS

This application is a continuation of U.S. patent application Ser. No. 16/464,397, filed on May 28, 2019, which is a U.S. national phase of International Patent Application No. PCT/EP2017/082962, filed on Dec. 15, 2017, which claims the benefit of U.S. Application No. 62/438,394, filed on Dec. 22, 2016, and United Kingdom Patent Application No. 1701173.5, filed on Jan. 24, 2017, each of which is incorporated herein by reference in its entirety.

STATEMENT AS TO RIGHTS TO INVENTIONS MADE UNDER FEDERALLY SPONSORED RESEARCH AND DEVELOPMENT

This invention was made with US Government support under Contract No. FA8651-14-C-0175 awarded by the United States Air Force. The US Government has certain rights in this invention.

FIELD OF INVENTION

The present invention relates to synthetic diamond plates, arrays of such plates, and mounting configurations for such plates.

BACKGROUND OF THE INVENTION

Plates of synthetic diamond material are now available in a variety of different grades and for a range of applications. Examples include optical grades of synthetic diamond material for optical applications, thermal grades of synthetic diamond material for thermal management in semiconductor applications, and electrically conductive boron doped diamond grades for electrodes in electrochemical applications. Synthetic diamond materials have a number of advantageous features for such applications including extreme hardness, high optical transparency across a wide frequency range, high thermal conductivity, chemical inertness, and wide potential window.

There remain several problems in utilizing synthetic diamond plates for certain applications. One of the main limitations for applications which require large area plates is that plates of synthetic diamond material are only available up to a certain size. This size limitation is a result of the difficulty in generating and maintaining the extreme conditions required to grow diamond material over a large area. The largest high quality synthetic diamond plates currently available are polycrystalline chemical vapour deposited (CVD) diamond plates which can be fabricated as circular wafers up to around 120 mm in diameter. The circular symmetry of such large area wafers is inherent from the circular symmetry of the microwave plasma activated chemical vapour deposition apparatus used in the synthesis process.

While synthetic diamond plates have extreme hardness and resistance to scratching, the diamond material is brittle and can be prone to fracture if not mounted and handled correctly. Furthermore, the combination of high hardness and low toughness can make diamond material difficult to process into precise geometries without fracturing the material or introducing significant surface and sub-surface damage.

Further still, while the chemical inertness of diamond can be an advantage for many applications, it does mean that diamond components can be difficult to bond into mounting configurations using standard adhesives and mounting structures. Further still, while the low thermal expansion coefficient of diamond material can be advantageous, for example to avoid thermal lensing effects, the rigidity of the diamond material in combination with a thermal expansion mismatch to the mounting material can lead to thermally induced stresses and potential de-bonding or fracture of the diamond component.

It will be apparent from the above that many of the advantageous features of diamond material also caused problems in manufacturing the material into engineered parts and integrating those parts into devices. That said, developments in diamond processing, coating, mounting, and bonding technologies now enable diamond to be manipulated and customized into a range of shapes and integrated and bonded into a wide range of devices and applications. For example, advances in diamond processing technologies have enabled the fabrication of complex three-dimensional diamond tool geometries and optical components. Surface finishing technologies can now achieve extreme levels of flatness and smoothness with low levels of surface damage for advanced optical applications. Diamond surfaces can be precisely patterned mimicking the structure of a moth's eye to achieve antireflective surfaces and diffractive optics without requiring further surface coatings thus increasing the damage threshold of diamond optics in high power applications. Further still, metallization and bonding schemes have been developed to integrate diamond components into electronic and optical devices with a high degree of mechanical stability and increased thermal performance. For advanced high power semiconductor devices, techniques have also been developed to directly grow diamond material onto semiconductor components—a direct integration that achieves step-changes in thermal performance.

Despite significant progress being made in terms of the size and form of synthetic diamond components and methodology for integrating such components into devices, limitations still exist and it is far from trivial to design, fabricate, and integrate synthetic diamond components into devices in a way which maximizes the advantageous features of diamond material while minimizing disadvantages arising from the extreme properties of the material.

SUMMARY OF THE INVENTION

The present inventors have realized that for certain applications which require a large area diamond component then it can be advantageous, or even required, to fabricate such a component utilizing a plurality of synthetic diamond plates rather than a single large area synthetic diamond plate. This may be the case if the area requirement for the end application exceeds the size of currently available synthetic diamond plates. Even when the application size requirement falls within current size limitations, if the application exerts significant stress on the synthetic diamond plate which could lead to fracture of a single large area diamond component, it may be advantageous to utilize a plurality of smaller synthetic diamond plates to reduce the impact of fracture failures. As such, some applications would be advantageously addressed using an array of synthetic diamond plates to increase the size and robustness of a component. Using an array of synthetic diamond plates also increases the degree of flexibility to form a wide range of geometric configurations, including planar and non-planar configurations.

In light of the above, the present inventors have considered requirements for provision of an array of synthetic diamond plates. In this regard, the first problem is that as previously indicated the large high quality synthetic diamond plates currently available are polycrystalline CVD diamond plates which are typically circular in form, the circular symmetry being inherent from the circular symmetry of the microwave plasma activated chemical vapour deposition apparatus used in the synthesis process. An array of such circular synthetic diamond plates includes significant gaps between the circular plates.

For an array of synthetic diamond plates with only small gaps between adjacent plates then a polygonal synthetic diamond plate shape would be preferable, e.g. triangular, square, rectangular, trapezoidal, pentagonal, or hexagonal. The preferred polygonal shape will depend on the desired array geometry including whether the array is to be planar or non-planar.

For most materials, selection of a desired polygonal plate geometry would not be particularly problematic. However, this can be problematic for synthetic diamond material due to its extreme hardness, low toughness, low thermal expansion coefficient, and difficulty in providing a strong and reliable bond. It is particularly problematic to provide a stable mounted synthetic diamond plate having a noncircular geometry as a mounted polygonal synthetic diamond plate is prone to high stresses in corner regions. This problem is exacerbated if the synthetic diamond plate is subjected to significant mechanical and thermal stresses in use leading to de-bonding or fracture of the plate.

In light of the above, the present inventors have determined that: (i) certain applications would be best served using an array of synthetic diamond plates; (ii) typical circular synthetic diamond plates do not pack together without leaving large gaps between adjacent plates and thus an array of polygonal synthetic diamond plates which can be closely packed together leaving smaller gaps will be preferable for certain applications; (iii) the geometry of polygonal synthetic diamond plates needs to be carefully designed to reduce stresses in use, particular in corner regions; and (iv) the mounting configuration also needs to be carefully designed to reduce stresses in use, particular in corner regions.

According to a first aspect of the present invention there is provided a synthetic diamond plate comprising:

a polygonal plate formed of synthetic diamond material,
the polygonal plate of synthetic diamond material having a thickness in a range 0.4 mm to 1.5 mm, and
rounded corners having a radius of curvature in a range 1 mm to 6 mm.

With regard to this aspect of the invention, it has been found that a combination of thickness and corner radius of curvature is important for providing a polygonal synthetic diamond plate which has sufficient strength and which has reduced stress concentration in the corners when mounted in use.

According to a second aspect of the present invention there is provided an array comprising a plurality of polygonal synthetic diamond plates according to the first aspect of the invention. The polygonal shaped synthetic diamond plates can be close packed to form an array with a reduced gap area compared with circular plates.

According to a third aspect of the present invention there is provided a mounted synthetic diamond plate comprising:

a polygonal synthetic diamond plate according to the first aspect of the invention; and
a base to which the polygonal synthetic diamond plate is bonded,
wherein the base comprises a cooling channel.

With regard to this aspect of the invention, it has been found that the provision of a cooling channel in the base of a mounted polygonal synthetic diamond plate can further reduce stress concentration in corners of the polygonal synthetic diamond plate.

According to a fourth aspect of the present invention there is provided an array of mounted synthetic diamond plates comprising:

a plurality of mounted synthetic diamond plates according to the third aspect of the invention,
wherein the cooling channels of the mounted synthetic diamond plates are linked to form
a common cooling channel across the array of mounted synthetic diamond plates.

With regard to this aspect of the invention, it has been found that an array of mounted synthetic diamond plates can be linked to have a common cooling channel to reduce stress concentration in corners of the polygonal synthetic diamond plates while maintaining a relatively simple cooling system structure.

Embodiments of the present invention including further optional and preferred features are described in the detailed description.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF THE INVENTION

Figure 1A:
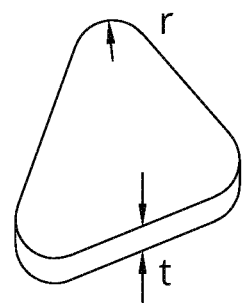
FIGS. 1(a) to 1(f) show schematic illustrations of polygonal synthetic diamond plates: (a) triangular; (b) square (c) rectangular; (d) trapezoidal; (e) pentagonal, or (f) hexagonal.
Figure 1B:
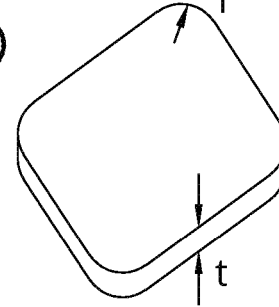
Figure 1C:
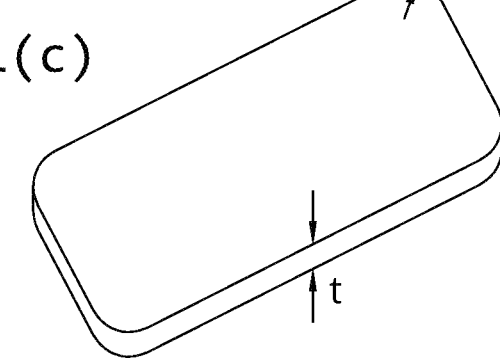
Figure 1D:
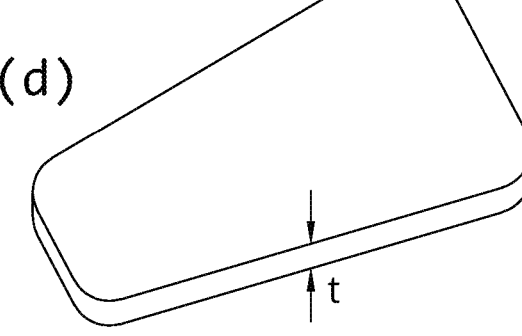
Figure 1E:
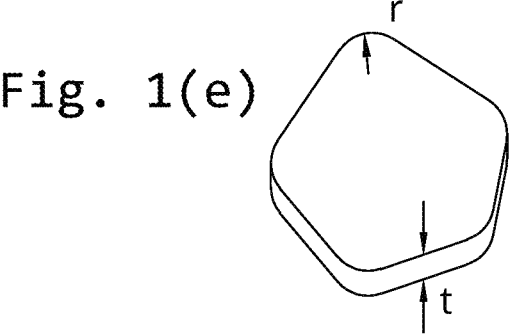
Figure 1F:
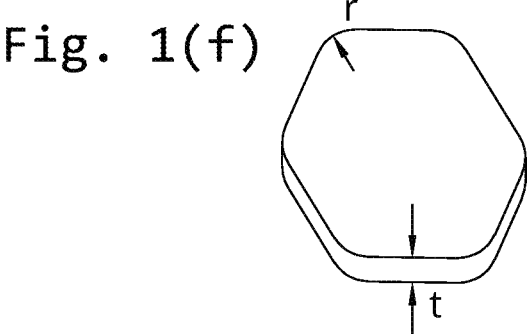

As described in the summary of invention section, one aspect of the present invention is concerned with the fabrication of polygonal synthetic diamond plates which can be configured into an array. For example, the polygonal plates of synthetic diamond material can be triangular, square, rectangular, trapezoidal, pentagonal, or hexagonal as illustrated in FIGS. 1(a) to 1(f). The preferred polygonal shape will depend on the desired array geometry including whether the array is to be planar or non-planar. For example, triangular, square, rectangular, and hexagonal plates can be used to form planar arrays whereas trapezoidal and pentagonal plates are more suitable for fabricating non-planar arrays such as over conical or curved mounting configurations.

It has been found that a combination of thickness t and corner radius of curvature r of the polygonal synthetic diamond plates is important for providing a polygonal synthetic diamond plate which has sufficient strength and which has reduced stress concentration in the corners when mounted in use and while also providing sufficient heat spreading capability. The polygonal plates of synthetic diamond material have a thickness in a range 0.4 mm to 1.5 mm and optionally in a range 4 mm to 1.2 mm, 0.4 mm to 1.0 mm, 0.4 mm to 0.8 mm, or 0.5 mm to 0.7 mm. The polygonal plates of synthetic diamond material also have rounded corners having a radius of curvature in a range 1 mm to 6 mm and optionally in a range 1 mm to 5 mm, 2 mm to 4 mm, or 2 mm to 3 mm. The polygonal plates of synthetic diamond material can have a largest linear dimension in a range 20 mm to 120 mm, 20 mm to 100 mm, 20 mm to 80 mm, 20 mm to 60 mm, or 20 mm to 40 mm. Such plates can be formed of polycrystalline CVD diamond material. The type and grade of synthetic diamond material will depend on the end application requirements. For example, the polygonal synthetic diamond plates can be formed of an optical grade of synthetic diamond material and an array of such plates can form an optical window with each polygonal synthetic diamond plate defining a clear aperture for transmission of light. Alternatively, the polygonal synthetic diamond plates can be formed of a thermal grade of synthetic diamond material and an array of such plates can form a heat spreading substrate mounted on a heat sink for thermal management of a plurality of semiconductor components. Alternatively still, the polygonal synthetic diamond plates can be formed of electrically conductive boron doped diamond material and an array of such plates can form an array of electrodes for electrochemical applications.

It has been found that for polygonal synthetic diamond plates, sharp corners are not favourable from the perspective of stress concentrations either from the perspective of the synthetic diamond plate or the mount on which the plate it bonded. It is notable, for example, that a square plate geometry has a significantly higher maximum principal stress in the corners of the synthetic diamond plate than in a circular plate geometry. The concern here is that these stresses present a risk to the synthetic diamond plate integrity and that a safety factor should be observed (e.g. such that the maximum stress is at least four times lower than the theoretical value for synthetic diamond fracture). Stresses have been mapped from −200 to +200 MPa for different configurations with the working hypothesis that a value below 80 MPa gives a ×4 safety factor. For example, for a 25 mm square synthetic diamond plate it is found that a 2 mm internal radius of curvature at the corners gave a significant reduction in stress in the synthetic diamond plate and the mount on which the plate is bonded, but that increasing the radius of curvature to significantly larger values doesn't give a substantial further improvement in stress reduction. Furthermore, keeping the radius of curvature small avoids undue clear aperture reduction. As such, there is an optimal range for radius of curvature at the corners of a polygonal plate of synthetic diamond material.

The effect of varying thickness of the synthetic diamond plates was studied by modelling mounted diamond plates of thickness varying between, for example, 0.45 mm and 1.0 mm. The 0.45 mm and 0.5 mm thick synthetic diamond windows are both in compression while for 0.6 mm thickness and above the synthetic diamond plates are in tension on the top surface of the plates. Increasing the thickness leads to an increase in tensile stress which can ultimately lead to failure of the synthetic diamond plate.

Reducing the thickness of the polygonal synthetic diamond plate and providing suitably rounded corners can thus ensure that the stress in the plate when bonded to a mounting is essentially all compressive so there is no risk of fracture. However, there are concerns over the effectiveness of a thinner window in terms of basic strength and also in terms of heat spreading capability. In this regard, a mechanical model was run as a steady state thermal model assuming simplified boundary conditions of a uniform 0.83 W/mm$^2$ heat flux on the surface of the synthetic diamond plate, a coolant fluid temperature of 25° C. and a boundary film condition simplified to give 5,000W/m$^2$K heat transfer coefficient. The models show that, as expected, the thinner synthetic diamond plates run somewhat hotter under these conditions. As such, for certain applications a plate thickness of greater than 0.4 or 0.45 mm can be preferable.

Figure 2A:
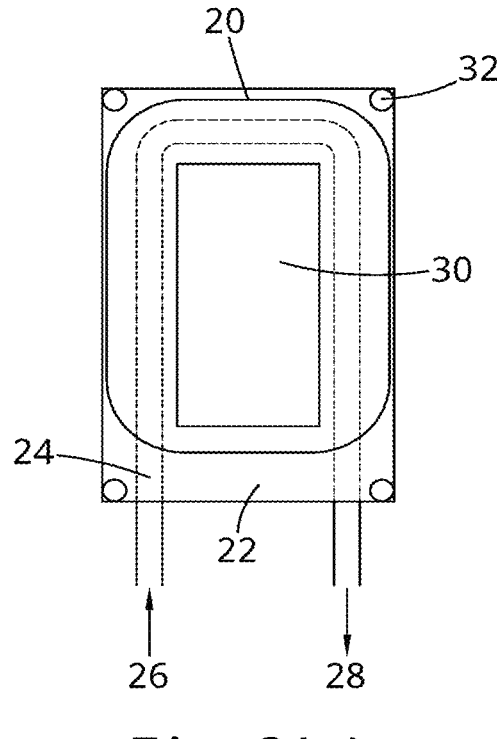
FIGS. 2(a) and 2(b) show different views of a mounted polygonal synthetic diamond plate.

FIG. 2(a) shows an example of a mounted synthetic diamond plate. The mounted synthetic diamond plate comprises a polygonal synthetic diamond plate 20 as previously described and a base 22 to which the polygonal synthetic diamond plate 20 is bonded. The base 22 comprises a cooling channel 24 having an inlet 26 and an outlet 28. It has been found that the provision of a cooling channel 24 in the base of a mounted polygonal synthetic diamond plate can further reduce stress concentration in corners of the polygonal synthetic diamond plate 20. Preferably the cooling channel 24 follows the polygonal outline of the polygonal synthetic diamond plate 20 and also has curved corners as illustrated by the dashed lines in FIG. 2(a) which show the path of the cooling channel 24 through the base 22. The base 22 defines an aperture 30 across which the polygonal synthetic diamond plate 20 is bonded to form an optical window. Fastening holes 32 are also provided in the base for mounting to a further support plate to form an array of such mounted synthetic diamond plates.

Figure 2B:
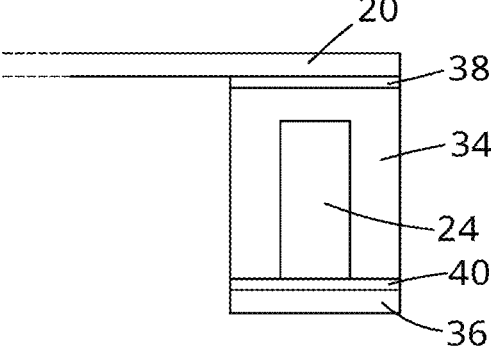

FIG. 2(b) shows a cross-section through a portion of the mounted synthetic diamond plate. The base comprises a mount 34 in which the cooling channel 24 is formed and a back plate 36 which seals the cooling channel. The mount and back plate can be formed of molybdenum, a molybdenum alloy, or silicon carbide. The polygonal synthetic diamond plate 20 and the back plate 36 are bonded to the mount 34 via, for example, braze bonds, diffusion bonds, or other suitable bonds 38, 40. It has been found that increasing the thickness of the back plate under the channel reduces stress in the polygonal synthetic diamond plate and mount. It has also been found that rounding the cooling channel also helps to stiffen the mount and reduce stress in the polygonal synthetic diamond plate. Further still, reducing the thickness of one or both of the bonds 38, 40 (e.g. to 0.14 mm) also has been found to reduce stress in the polygonal synthetic diamond plate.

In addition, reducing the width of the bonds 38, 40 (e.g. from 5 mm to 3 mm) again achieves a reduction in stress. Accordingly, provision of rounded corners for the cooling channel, increasing the thickness of the back plate, and reducing the thickness and width of the bonds have all been found to provide a more favourable stress distribution in the mounted polygonal synthetic diamond plate configuration.

For certain applications the polygonal synthetic diamond plate is bonded to the base via a bond which has a bonding temperature less than 800° C., 700° C., 600° C., 500° C., or 400° C. Examples include low temperature braze bonds and low temperature metal diffusion bonds (e.g. using gold or aluminium). A low temperature bond is advantageous to alleviate problems of thermal expansion coefficient mismatch between the diamond plate and the base generating stress and potentially leading to warpage of the diamond plate from a desired geometry (e.g. a precise optical flatness).

For certain applications, both the bond 38 between the polygonal synthetic diamond plate and mount and the bond 40 between the back plate and mount should be configured to be leak tight to $<1\times10^{-9}$ mbar 1/s. When this is a critical application requirement, materials utilized for the mount 34 and back plate 36 must also have sufficiently low porosity to meet this requirement.

Figure 3:
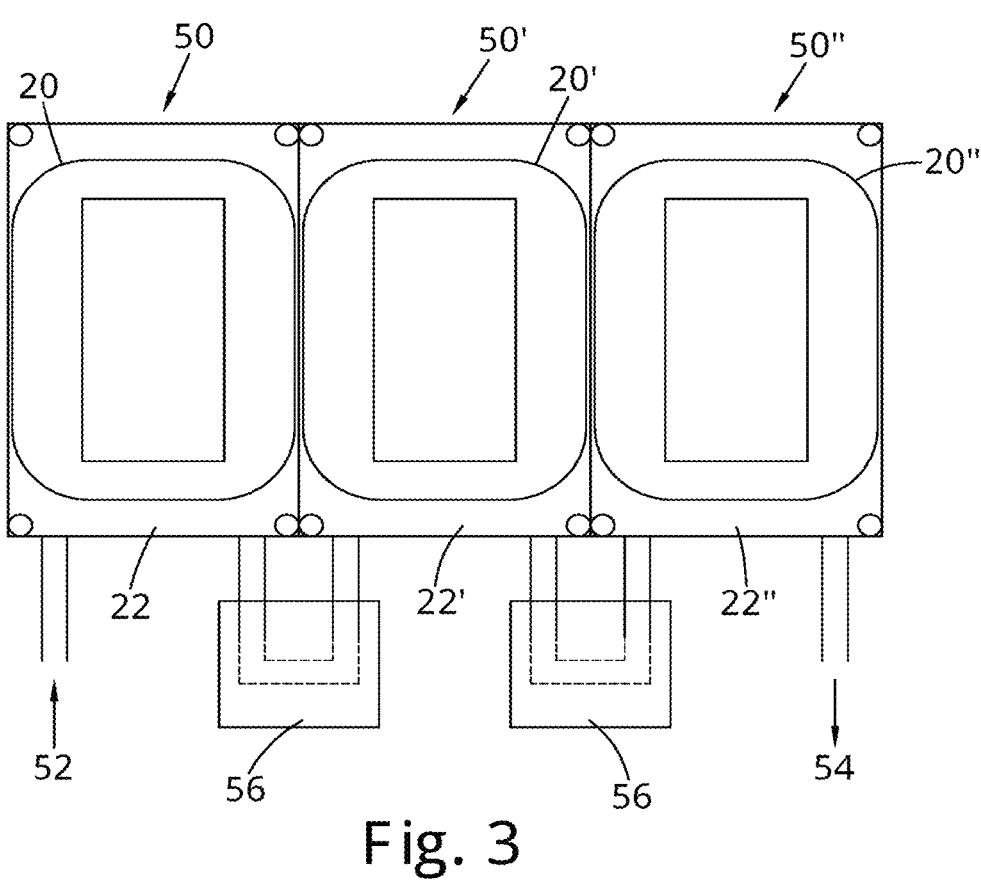
FIG. 3 shows an array of mounted synthetic diamond plates with cooling channels linked via cooling blocks to form a common cooling channel.

FIG. 3 shows an array of mounted synthetic diamond plates which comprises a plurality of mounted synthetic diamond plates 50, 50', 50''. As previously described, each mounted synthetic diamond plate comprises a polygonal synthetic diamond plate 20, 20', 20'' and a base 22, 22', 22'' to which the polygonal synthetic diamond plate is bonded. Each base comprises a cooling channel having an inlet and an outlet. The cooling channels of the mounted synthetic diamond plates are linked to form a common cooling channel across the array of mounted synthetic diamond plates with a single inlet 52 and a single outlet 54. In the illustrated embodiment, the cooling channels of adjacent mounted synthetic diamond plates are linked via cooling blocks 56 in which link channels are disposed.

Figure 4:
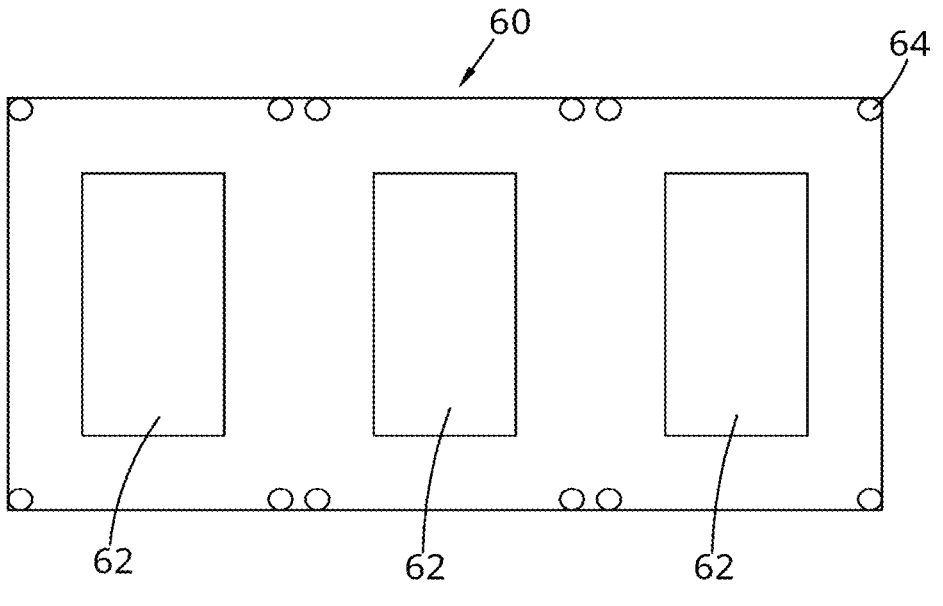
FIG. 4 shows a support plate on which the array of mounted synthetic diamond plates are mounted.

FIG. 4 shows a support plate 60 to which each of the mounted synthetic diamond plates can be mounted to form the array. The support plate 60 comprises apertures 62 and fastening holes 64 corresponding to those in each of the mounted synthetic diamond plates. As an alternative to providing cooling blocks as a means of linking, the cooling channels of adjacent mounted synthetic diamond plates as illustrated in FIG. 3, one or more channels can be provided in the support plate to link the cooling channels of the mounted synthetic diamond plates.

Embodiments of the present invention are capable of providing arrays of polygonal synthetic diamond plates in a range of geometries and for a range of applications. Characteristics of the synthetic diamond plates and of the mounting configuration have been investigated to take into account stress management, strength, and thermal performance. Management of these parameters also enables the mounted polygonal synthetic diamond plates to achieve and maintain a high degree of flatness and geometric stability which can be critical for certain applications.

While this invention has been particularly shown and described with reference to embodiments, it will be understood to those skilled in the art that various changes in form and detail may be made without departing from the scope of the invention as defined by the appending claims.

What is claimed is:

1. An array comprising a plurality of polygonal synthetic diamond plates, each synthetic diamond plate of the plurality of diamond plates comprising:

a polygonal plate formed of synthetic diamond material, the polygonal plate of synthetic diamond material having a thickness in a range 0.4 mm to 1.5 mm, and rounded corners having a radius of curvature in a range 1 mm to 6 mm, wherein the polygonal synthetic diamond plates are formed of a thermal grade of synthetic diamond material and the array forms a heat spreading substrate mounted on a heat sink for thermal management of a plurality of semiconductor components.

2. The array according to claim 1, wherein each polygonal plate of synthetic diamond material is triangular, square, rectangular, trapezoidal, pentagonal, or hexagonal.

3. The array according to claim 1, wherein the thickness is in a range 0.4 mm to 1.2 mm, 0.4 mm to 1.0 mm, 0.4 mm to 0.8 mm, or 0.5 mm to 0.7 mm.

4. The array according to claim 1, wherein the radius of curvature of the rounded corners is in a range 1 mm to 5 mm, 2 mm to 4 mm, or 2 mm to 3 mm.

5. The array according to claim 1, wherein each polygonal plate of synthetic diamond material has a largest linear dimension in a range 20 mm to 120 mm, 20 mm to 100 mm, 20 mm to 80 mm, 20 mm to 60 mm, or 20 mm to 40 mm.

6. The array according to claim 1, wherein the polygonal plate is formed of polycrystalline CVD diamond material.

* * * * *